(12) United States Patent
Fei et al.

(10) Patent No.: US 8,392,009 B2
(45) Date of Patent: Mar. 5, 2013

(54) ADVANCED PROCESS CONTROL WITH NOVEL SAMPLING POLICY

(75) Inventors: Wang Jo Fei, Hsin-Chu (TW); Andy Tsen, Chung-Ho (TW); Ming-Yu Fan, Hsin-Chu County (TW); Jill Wang, Hsinchu (TW); Jong-I Mou, Hsinpu Township, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 765 days.

(21) Appl. No.: 12/415,366

(22) Filed: Mar. 31, 2009

(65) Prior Publication Data

US 2010/0249974 A1 Sep. 30, 2010

(51) Int. Cl.
*G06F 19/00* (2006.01)
*G01R 31/26* (2006.01)
*G06K 9/00* (2006.01)
*G06F 17/50* (2006.01)
*G01T 1/24* (2006.01)

(52) U.S. Cl. ............ 700/108; 250/370.01; 438/14; 438/17; 438/18; 382/144; 382/145; 382/149; 700/91; 700/96; 700/103; 700/109; 700/110; 700/121; 703/14

(58) Field of Classification Search ............ 324/754.22; 438/17, 14, 18; 700/91, 96, 103, 108–110, 700/121; 703/14; 382/144, 145, 149; 250/370.01
See application file for complete search history.

(56) References Cited

U.S. PATENT DOCUMENTS

| | | | | |
|---|---|---|---|---|
| 4,967,381 A | * | 10/1990 | Lane et al. ............... | 702/81 |
| 5,114,242 A | * | 5/1992 | Gat et al. ............... | 374/128 |
| 5,383,354 A | * | 1/1995 | Doris et al. ............... | 73/105 |
| 5,497,331 A | * | 3/1996 | Iriki et al. ............... | 700/121 |
| 5,649,063 A | * | 7/1997 | Bose ............... | 706/23 |
| 5,750,908 A | * | 5/1998 | Drohan ............... | 73/865.9 |
| 5,760,951 A | * | 6/1998 | Dixon et al. ............... | 359/385 |
| 6,218,886 B1 | * | 4/2001 | Balistreri et al. ............... | 327/378 |
| 6,410,351 B1 | * | 6/2002 | Bode et al. ............... | 438/14 |
| 6,456,736 B1 | * | 9/2002 | Su et al. ............... | 382/147 |
| 6,707,936 B1 | * | 3/2004 | Winter et al. ............... | 382/149 |
| 6,731,391 B1 | * | 5/2004 | Kao et al. ............... | 356/605 |
| 6,804,563 B1 | * | 10/2004 | Lafaye de Micheaux ...... | 700/51 |
| 6,809,534 B2 | * | 10/2004 | Yamada ............... | 324/754.22 |
| 6,819,125 B1 | * | 11/2004 | Green et al. ............... | 324/754.03 |
| 6,897,953 B2 | * | 5/2005 | Watanabe et al. ............... | 356/317 |
| 6,947,135 B2 | * | 9/2005 | Johnson ............... | 356/237.2 |
| 7,016,049 B2 | * | 3/2006 | Kurosawa ............... | 356/508 |
| 7,019,815 B2 | * | 3/2006 | Jasper et al. ............... | 355/55 |

(Continued)

OTHER PUBLICATIONS

Khan et al., "Virtural Metrology and Feedback Control for Semiconductor Manufacturing Process Using Recursive Partial Least Squares", 2008, Elsevier, p. 961-974.*

(Continued)

*Primary Examiner* — Charles Kasenge
*Assistant Examiner* — Thomas Stevens
(74) *Attorney, Agent, or Firm* — Haynes and Boone, LLP

(57) ABSTRACT

The present disclosure provides a semiconductor manufacturing method. The method includes performing a first process to a first plurality of semiconductor wafers; determining a sampling rate to the first plurality of semiconductor wafers based on process quality; determining sampling fields and sampling points to the first plurality of semiconductor wafers; measuring a subset of the first plurality of semiconductor wafers according to the sampling rate, the sampling fields and the sampling points; modifying a second process according to the measuring; and applying the second process to a second plurality of semiconductor wafers.

19 Claims, 7 Drawing Sheets

U.S. PATENT DOCUMENTS

| | | | |
|---|---|---|---|
| 7,030,961 B2* | 4/2006 | Den Boef et al. | 355/53 |
| 7,433,524 B2* | 10/2008 | Yamaguchi et al. | 382/233 |
| 8,017,411 B2* | 9/2011 | Sonderman et al. | 438/14 |
| 2002/0018599 A1* | 2/2002 | Kamon | 382/260 |
| 2002/0193899 A1* | 12/2002 | Shanmugasundram et al. | 700/108 |
| 2003/0109070 A1* | 6/2003 | Hosoya et al. | 438/14 |
| 2003/0200134 A1* | 10/2003 | Leonard et al. | 705/10 |
| 2004/0174508 A1* | 9/2004 | Den Boef et al. | 355/53 |
| 2004/0210413 A1* | 10/2004 | Dorough et al. | 702/117 |
| 2006/0015206 A1* | 1/2006 | Funk et al. | 700/121 |
| 2006/0166606 A1* | 7/2006 | Kobayashi et al. | 451/6 |
| 2008/0183411 A1* | 7/2008 | Funk et al. | 702/84 |
| 2008/0243297 A1* | 10/2008 | Winkler et al. | 700/121 |
| 2008/0286885 A1* | 11/2008 | Izikson et al. | 438/7 |

OTHER PUBLICATIONS

Patel et al., "In Situ Estimation of Blanket Polish Rates and Wafer-to-Wafer Variation" ,2002, IEEE, p. 513-522.*

Nurani et al., "In-Line Defect Sampling Methodology in Yield Management: An Integrated Framework", 2002, IEEE, p. 506-517.*

\* cited by examiner

ADVANCED PROCESS CONTROL WITH NOVEL SAMPLING POLICY

BACKGROUND

Advanced process control (APC) is applied to semiconductor integrated circuit (IC) technology for manufacturing quality and efficiency, especially when semiconductor IC technology is continually progressing to circuit layouts having smaller feature sizes as well as increased density. During a semiconductor process with advanced process control (APC), various measurements are implemented. However, the existing measurements for APC in semiconductor manufacturing place a heavy load on metrology. Furthermore, the existing measurements have a sampling rate, sampling field/location selected manually based on engineer experience with limited accuracy and efficiency. There is no risk management in deciding the sampling rate. Further, too many measurement points are needed to achieve an acceptable accuracy for proper APC application. Continued improvements to a semiconductor processing tool with advanced process control are therefore desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

DETAILED DESCRIPTION

The present disclosure relates generally to lithography systems and a method of utilizing such systems. It is understood, however, that the following disclosure provides many different embodiments, or examples, for implementing different features of the invention. Specific examples of components and arrangements are described below to simplify the present disclosure. These are, of course, merely examples and are not intended to be limiting.

Figure 1:
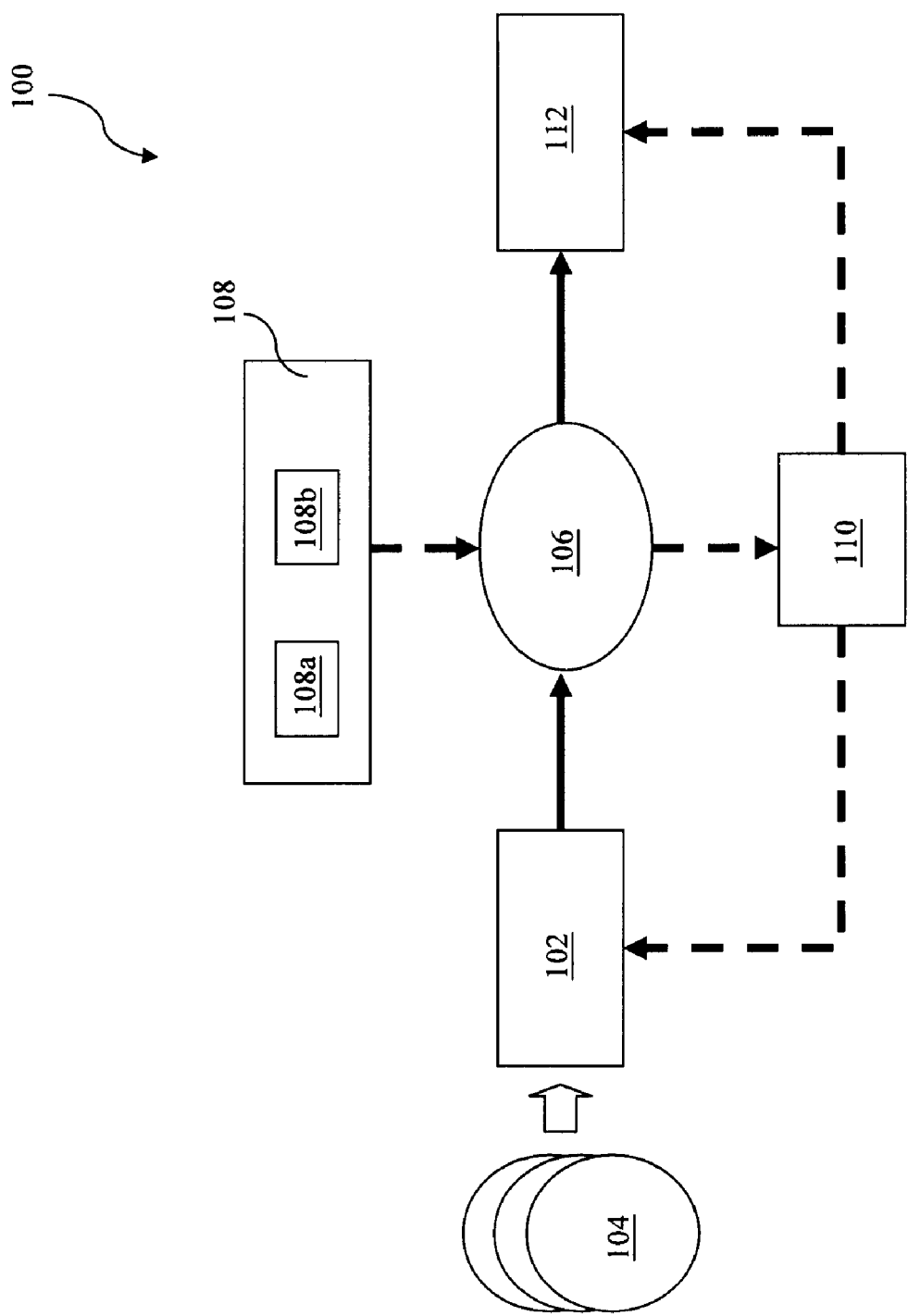
FIG. 1 is a schematic view of one embodiment of a semiconductor processing system constructed according to various aspects of the present disclosure.

Referring to FIG. 1, illustrated is a schematic view of one embodiment of a semiconductor processing system 100. The semiconductor processing system 100 and a method of implementing the same will be explained below in detail. The semiconductor processing system 100 includes an exemplary processing tool 102 designed to perform one semiconductor process to one or more semiconductor wafers 104. The semiconductor processing tool 102 is designed to perform the semiconductor process, such as etch, deposition, thermal oxidation, implantation, lithography exposure, and ion implantation. In one embodiment, the semiconductor tool 102 is an etching tool to etch trenches in a semiconductor substrate as one step to form shallow trench isolation (STI). In another example, the etch tool is used to trenches in a dielectric layer for forming an interconnect structure in a dual damascene process. In another embodiment, the semiconductor processing tool 102 is a deposition tool, such as chemical vapor deposition (CVD) tool or physical vapor deposition (PVD) tool. For example, the CVD deposition tool is used to form a dielectric layer on a semiconductor wafer for isolation. In another example, the PVD tool is used to form a metal layer for interconnection. In another embodiment, the semiconductor processing tool is an ion implantation tool to perform an ion implantation process to form one or more doped features, such as source/drain or wells, in the semiconductor substrate. In another embodiment, the semiconductor processing tool is a chemical mechanical polishing (CMP) tool to polish a wafer to reduce the thickness thereof and provide a planarized surface. In another embodiment, the semiconductor processing tool is a lithography exposure tool to expose an imaging layer on a wafer using a radiation energy in order to form the patterned imaging layer for other processing steps, such as etching, deposition, or ion implantation. In one example, the semiconductor processing tool can be a cluster tool having multiple processing chambers with a same or different processing functions. For example, a PVD tool may include four processing chambers, one used to form titanium nitride, one used to form titanium, and the other two used to form aluminum, respectively.

The semiconductor wafers (or wafers) 104 include silicon wafers. Alternatively, the semiconductor wafers can be silicon germanium wafers or wafers of other proper semiconductor materials. The semiconductor wafers may include a portion of an integrated circuit and interconnect structure. For example, the semiconductor wafers may include various doped features in silicon and may additionally include others features, such as gate electrodes and/or metal lines. The semiconductor wafers 104 are sent to the semiconductor processing tool 102, the intended process of the semiconductor processing tool 102 is applied to the semiconductor wafers 104. Thereafter, the semiconductor wafers 104 are selectively sent to one or more metrology tool 106 for measurement according to an optimal sampling determined by a sampling module 108 such that only a subset of the semiconductor wafers are measured by the metrology tool.

The metrology tool 106 may be one of electrical, optical, and/or analytical tools, such as microscopes, micro-analytical tools, line width measurement tools, particle distribution tools, surface analysis tools, stress analysis tools, resistivity and contact resistance measurement tools, mobility and carrier concentration measurement tools, junction depth measurement tools, film thickness measurement tools, gates oxide integrity test tools, C-V measurement tools, focused ion beam (FIB), and other test and measurement tools. In this particular case, the metrology tool 106 is capable to measure one or more relevant parameters of the wafers 104 after the process implemented by the processing tool 102. For example, when the processing tool is an etch tool to etch trenches in the wafers, the metrology tool can be a tool capable to measure the trench depth, and/or trench width. In another example, when the processing tool is a deposition tool to form a material film on the wafers, the metrology tool can be a tool capable to measure the film thickness. In another example, when the processing tool is an ion implantation tool to form various doped features in the wafers, the metrology tool can be a tool capable to measure the doping concentration and/or resistance. The measurement step has a manufacturing cost and impact to the manufacturing throughput and wafer cycle time. Therefore only a subset of the wafers are measured by the metrology tool. In the existing practice, the subset of the wafers are selected from the processed wafers 104 manually based on engineer experience. Furthermore, in the existing practice, the fields and positions to be measured are also chosen manually. According to the present disclosure, the sampling is determined based on process quality, and may be additionally based on the metrology loading. More specifically, the sampling is dynamically tunable and is determined based on the process quality, metrology loading and/or other process characteristics.

The sampling module 108 may include two sub-modules. In one embodiment, the sampling module 108 includes a sampling rate sub-module 108a designed to determine an optimal sampling rate (or sampling rate) based on the process quality. The sampling rate is defined as the frequency of sampling or, in other words, the ratio of measured wafers to the fabricated wafers in a period of time. The sampling rate is determined by the process quality. Particularly, the optimal sampling rate is quantitatively determined with a process capability index Cpk by the sampling rate sub-module 108a. In another embodiment, the sampling module 108 includes a sampling field/point sub-module 108b designed to determine sampling fields, sampling points and/or the numbers of the sampling fields and sampling points based on various characteristics of the process quality and/or product quality. The wafer usually is divided into a plurality of fields. In one example, a circuit pattern defined in a reticle (or mask) is transferred to one field of the wafer and is repeated to each field of the wafer. In another example, a field of the wafer includes a die. Since the wafer includes a plurality of fields, only a subset of the fields in the wafer can be measured considering the manufacturing cost and efficiency. These measured fields are referred to as sampling fields. Furthermore, only one or more location in a field or in other locations of the wafer can be measured. These measured locations are referred to as sampling points. In various examples, a sampling point is at a center, or edge of a field. In other examples, a sampling point is at a center or edge of a wafer, or a scribe line of the wafer. In various examples of the sampling field/point, the number of full fields to be measured can be determined using a cluster method. The number of golden points to be measured can be determined according to the residual standard error (RSE). The locations of the golden points can be determined according to the standard deviation. In another embodiment, the sampling module 108 includes both the sampling rate sub-module 108a and the sampling field/point sub-module 108b, coordinates the both sub-modules to dynamically tune and optimize the sampling rate, fields, and points according various characteristics of the process quality and/or product quality for sampling efficiency and coverage. In furtherance of the embodiment, the two sub-modules 108a and 108b are integrated with optimized coordination and efficiency in determining the sampling rate and field/point. The sampling module 108 and its method will be further described in detail.

The subset of the wafers is chosen according to the optimal sampling rate from the sampling rate sub-module 108. Thereafter the subset of the wafers may be further specified according to a lot sampling method by specifying the processing chamber identification and wafer identification for optimized chamber coverage. Additionally or alternatively, the sampling fields/points are chosen accordingly. Thus chosen subset of the wafers are measured on the chosen fields/points by the metrology tool 106, the measured results are provided to a process control module 110 for analysis, extraction and/or calculation to find out product parameter deviation and/or process deviation. The measured results may include sheet resistance, reflectivity, stress, particle density, and critical dimension, to name a few. The process deviation and/or the product performance deviation are further feedback to the processing tool 102, and/or feed forward to a second processing tool 112 by modifying or adjusting the relevant processing condition, parameters and/or recipe. The second processing tool 112 is another processing tool designed to perform a second processing step to the semiconductor wafers after the process implemented by the processing tool 102. For example, the processing tool 102 is an etch tool to form a gate structure, the second processing tool 112 is an ion implantation tool to perform an ion implantation to tune the relevant electrical parameters, such as saturation current Isat.

Figure 2:
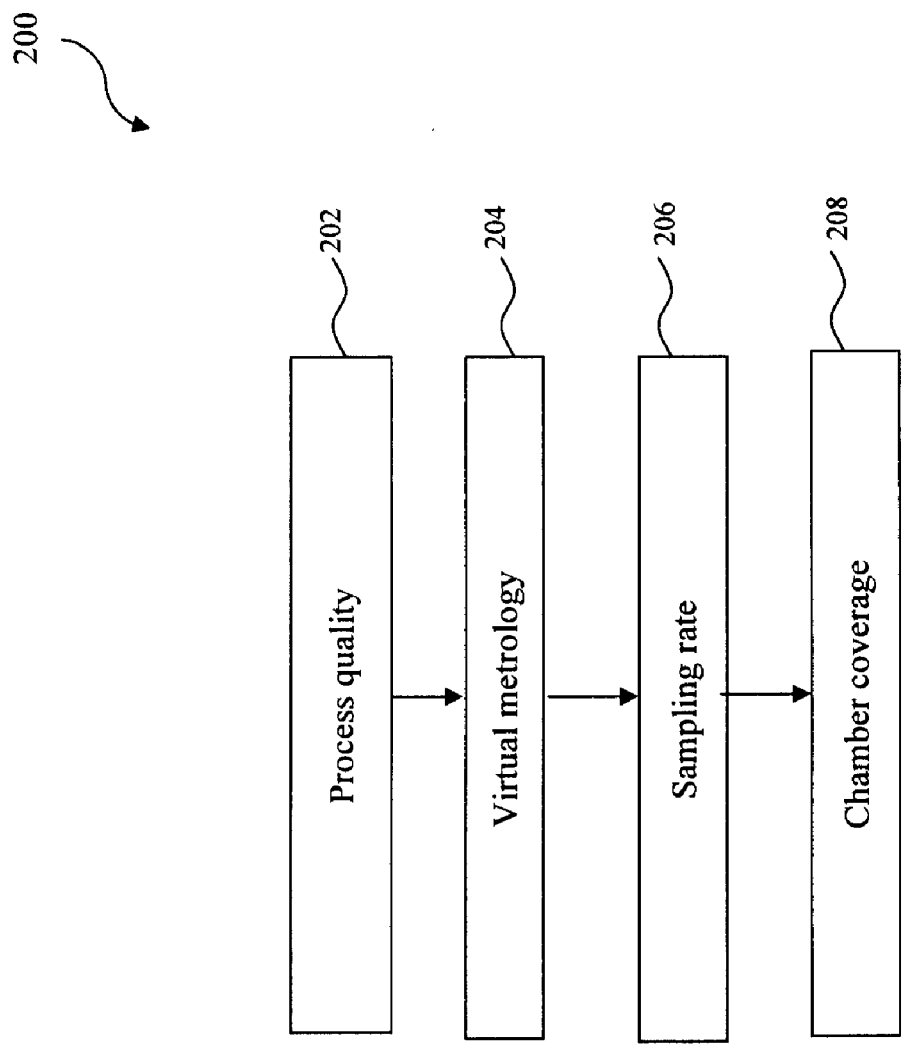
FIG. 2 is a flowchart of a sampling process implemented in the semiconductor processing system of FIG. 1 constructed according to various aspects of one embodiment of the present disclosure.

FIG. 2 is a flowchart of a sampling process 200 implemented by the sampling rate sub-module 108a of the semiconductor processing tool of FIG. 1 constructed according to various aspects of one embodiment of the present disclosure. With reference to FIGS. 1 and 2, the sampling process 200 begin at step 202 by calculating a process capability (index or parameter) Cpk based on the manufacturing data collected in a period of time, such as one month. The process capability parameter Cpk is an index that measures the process quality of a process, or how close a process is running to its specification limits, relative to the natural variability of the process. The greater the index Cpk, the less likely it is that the process will be outside of the specification. The process capability Cpk measures how close a process is to the target and how consistent the process is around the average performance. The product quality is also relevant to the process capability Cpk. The greater the index Cpk is, the overall product quality of the wafers processed by the associated process is higher.

By calculating the process capability Cpk, the process quality and/or the product quality can be properly evaluated accordingly. Cpk is defined mathematically as $$Cpk=\min[(USL-\mu)/3\sigma, (\mu-LSL)/3\sigma]$$

In which $\mu$ is the mean, $\sigma$ is the standard deviation, USL is the upper specification limit and LSL is the lower specification limit.

The process 200 proceeds to step 204 to determine if the virtual metrology method is used. A virtual metrology method may be additionally or alternatively used to predict the metrology results in order to save real metrology measurement. In one embodiment of the virtual metrology method, various characteristics of the processing tool are extracted from the processing tool. Then processing results to the wafers by the processing tool can be predicted based on the processing recipe, processing conditions (i.e., settings) and the characteristics of the processing tool. In one embodiment, the real metrology measurement may be reduced or replaced for a period of time according to the process quality and the product quality. For example, in a situation when the advanced process control is minor or skipped for a period of time due to a small deviation, the predicted result by the virtual metrology method can be utilized.

Figure 3:
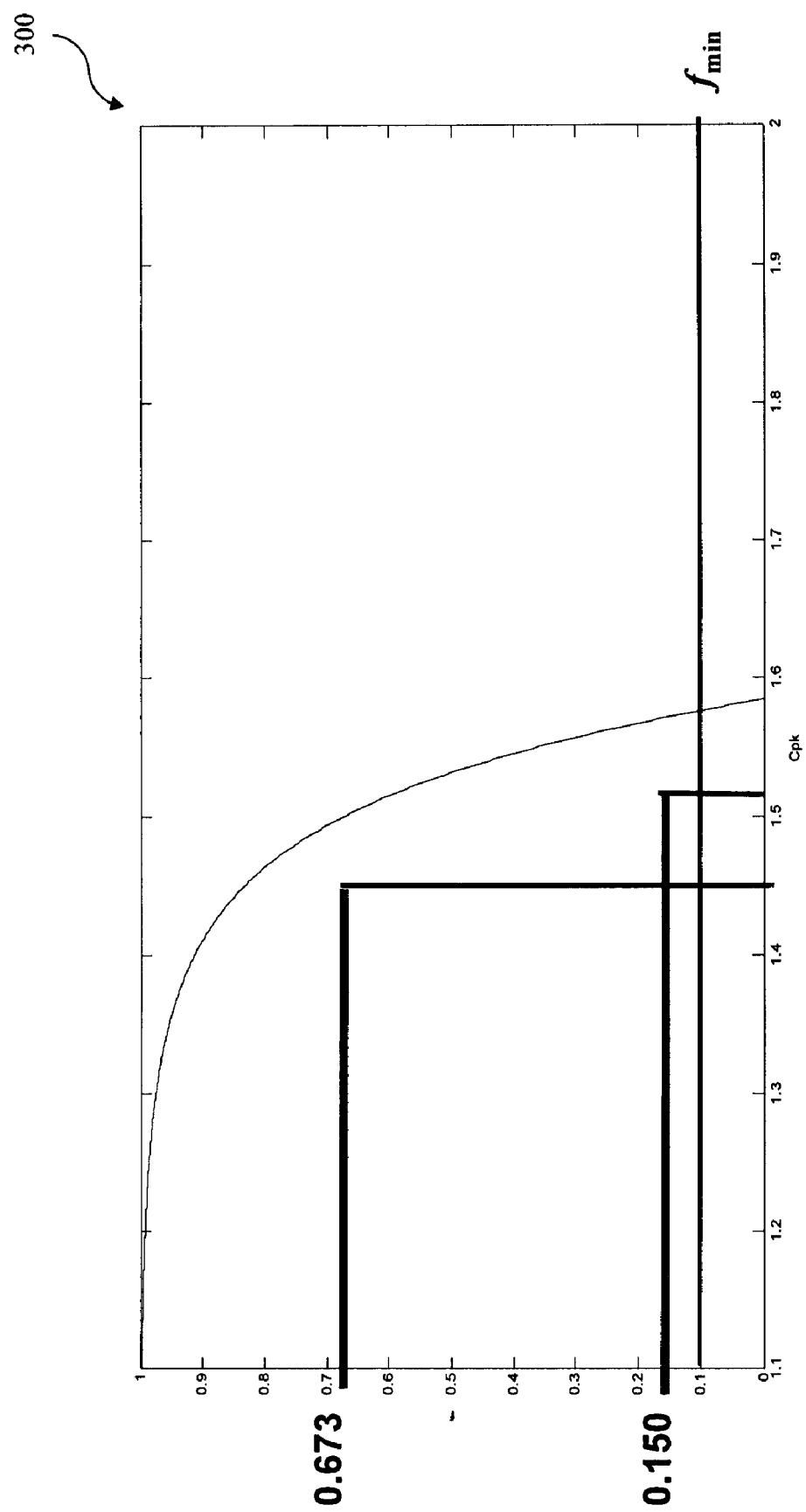
FIG. 3 is an exemplary diagram of Cpk vs. sampling rate constructed according to various aspects of one embodiment of the present disclosure.

The process 200 proceeds to step 206 by determining the sampling rate according to the Cpk. FIG. 3 provides an exemplary diagram 300 of Cpk vs. sampling rate constructed according to various aspects of one embodiment of the present disclosure. In the diagram 200, a curve is defined with x axis representing for the process capability Cpk and y axis representing for the sampling rate (labels as "f"). In one example, if the Cpk is 1.5, then the sampling rate f=0.673, as illustrated in FIG. 3. In another example, if the Cpk is 1.57, then the sampling rate f=0.15. a minimum sampling rate may be additionally defined as $f_{min}$. In this example, the minimum sampling rate is defined as 0.10 or 10%. The sampling rate f may be further checked by the minimum sampling rate. If the sampling rate determined from the Cpk is less than the minimum sampling rate, then the final sampling rate may be chosen as the minimum sampling rate. In this exemplary diagram, a sampling wafer quantity in a lot, represented by w, is 3 and an average outgoing quality level (AOQL) is 2 ppm (pieces per million).

Prior to determining the optimal sampling rate f based on the process capability Cpk, a formula relating f to Cpk is defined for the purpose. The curve f vs. Cpk provided in the diagram 200 of FIG. 3 is an example of the quantitative relation between f and Cpk. In one embodiment, the relational formula between Cpk and f is defined below.

The average outgoing quality (AOQ) is defined as $AOQ_{ij}=(1-F_{ij})P_{ij}$, in which i denotes a product i, j denotes a processing tool j, $AOQ_{ij}$ denotes an average outgoing quality for the product i and the processing tool j, $F_{ij}$ denotes an average sampling rate for the product i and the processing tool j, and $P_{ij}$ denotes defective rate for the product i and the processing tool j. The Fij is further defined as $F_{ij}=f_{ij}/[f_{ij}+(1-f_{ij})P_a^w]$, in which $f_{ij}$ is a sampling rate for the product i and the processing tool j, w is sampling wafer quantity in a lot, and Pa is probability of acceptance of a given lot. The defective rate is further defined as $P_{ij}=2[1-\Phi(3Cpk(i,j))]$, in which $\Phi$ is normal distribution function and Cpk(i,j) is process capability parameter Cpk for the product i and the processing tool j. In this procedure, the average outgoing quality level AOQL is given and $=AOQ_{ij}$ is also provided to be consistence with a formula as $AOQ_{ij}=<AOQL$. Thus, according to the given parameters and functions, including $AOQ_{ij}$, AOQL, $P_a$, w, $\Phi$, i and j, the sampling rate is quantitatively related to the process capability Cpk. When the Cpk is determined according to the historical data collected from products in a period of time, the sampling rate can be determined accordingly. Furthermore, thus determined sampling rate is a dynamic since it will change while the process changes and therefore the process capability Cpk changes. More generally, the sampling rate f is dynamically determined according the process quality, represented by an index such as the process capability Cpk, with reduced manufacturing cost, enhanced product coverage, and optimized accuracy reflecting the process shifting, drifting or any other changes.

Additionally, the metrology loading may be further considered in determining the optimal sampling rate. For example, based on the maximum metrology loading, a maximum sampling rate may be given according to the maximum metrology loading. If the sampling rate determined by the Cpk is greater than the maximum sampling rate, then the optimal sampling rate may be chosen as the maximum sampling rate.

The process 200 may proceed to step 208 by specifying the sampling wafer using wafer identifications and the associated processing chamber identifications for fully chamber coverage. In one embodiment, the sampling subset of wafers is chosen based on wafer identifications according to the processing chambers through which the wafer is processed, such that various processing chambers are fully covered by the sampling wafers.

Figure 4:
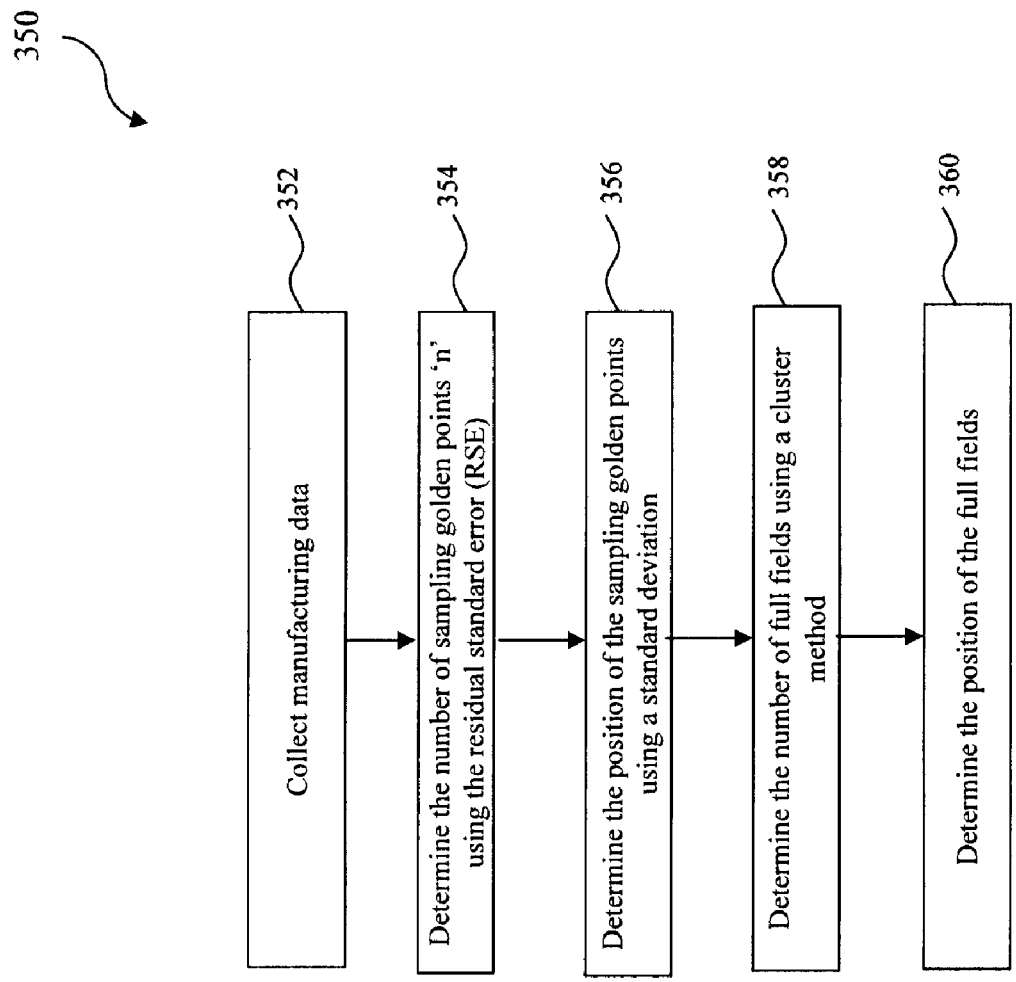
FIG. 4 is a flowchart of a sampling process implemented in the semiconductor processing system of FIG. 1 constructed according to various aspects of another embodiment of the present disclosure.

FIG. 4 is a flowchart of a sampling process 350 implemented by the sampling field/point sub-module 108b in the semiconductor processing system of FIG. 1 constructed according to various aspects of another embodiment of the present disclosure. The process 350 begins at step 352 by collecting the manufacturing data associated with the processed wafers are collected from the metrology tool and/or the processing tool generated in a period of time, such as one month. The manufacturing data are then analyzed relative to one or more critical parameters of the processed wafers, such that various characteristic numbers are extracted and will be used in next several steps to determine the numbers and positions of the golden points and full fields for sampling.

Figure 5:
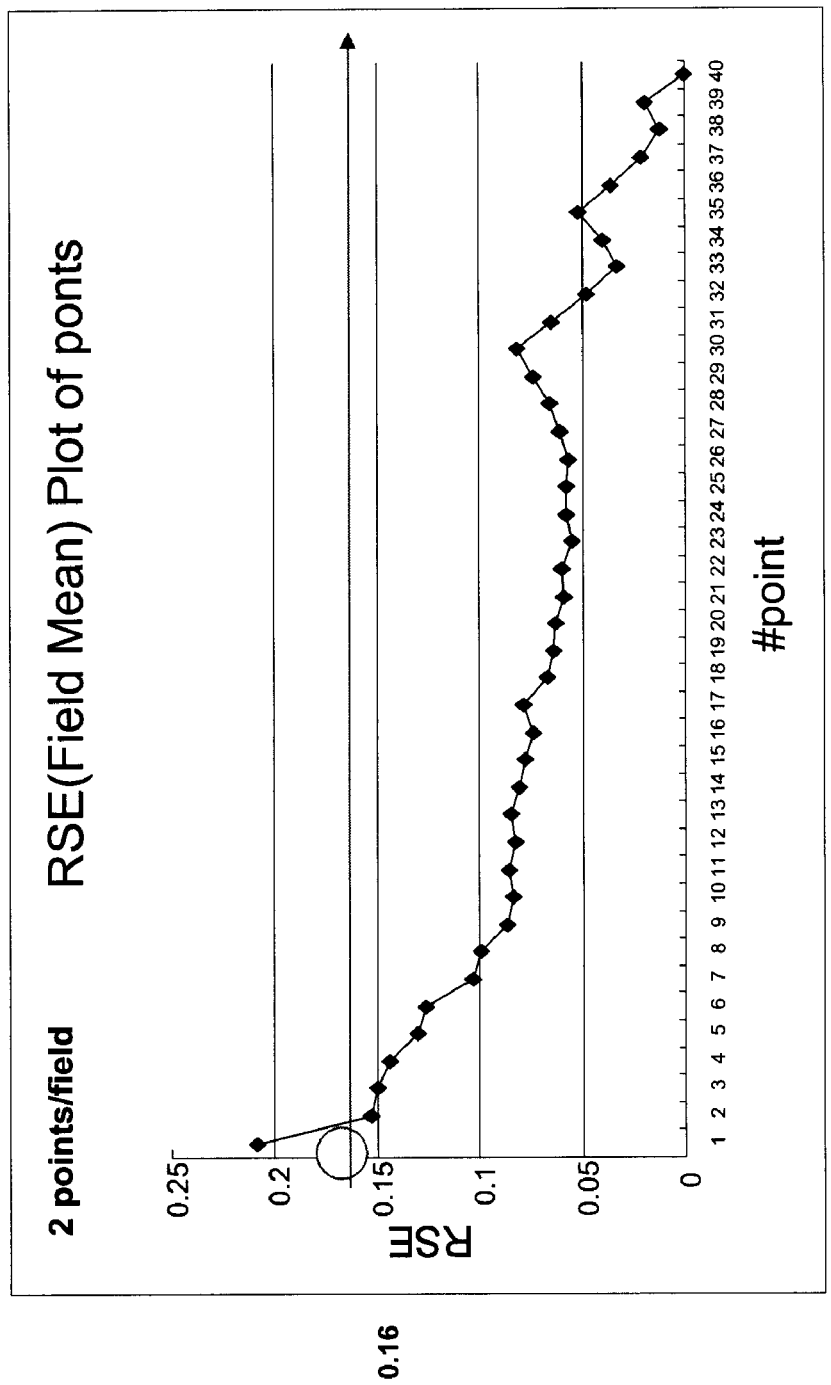
FIG. 5 is an exemplary chart of RSE vs. the number of points constructed according to various aspects of one embodiment of the present disclosure.

The process 350 proceeds to step 354 by determining the number of sampling golden points 'n' using the residual standard error (RSE). The sampling golden points are spots on a wafer to be measured by the metrology tool for the relevant data. To a chosen wafer for measurement, the number of the sampling golden points also needs to be determined prior to the measurement by the metrology tool. The RSE can be defined as the standard deviation of the sample mean estimate of a population mean. It can also be viewed as the standard deviation of the error in the sample mean relative to the true mean. RSE is usually estimated by the sample estimate of the population standard deviation divided by the square root of the sample size as RSE=s/Sqt(m), in which s is the sample standard deviation and m is the size of the sample. Thus RSE can be determined according the manufacturing data collected at step 352. The number of the sampling golden points n can be determined according to a given RSE. RSE (field mean) is plotted as a function of the number (#) of sampling points as illustrated in chart 370 of FIG. 5. In one example, when RSE is chosen to be less about 0.16, then the number of the sampling points should be 2 per field or greater.

The process 350 proceeds to step 356 by determining the position of the sampling golden points using the standard deviation (STD). The STD is a measure of the variability or dispersion of a data set. A low standard deviation indicates that all of the data points are very close to the same value, while high standard deviation indicates that the data are "spread out" over a large range of values. The STD is defined as $STD=Sqr[E((x-m)^2)]$, in which x is a random variable, E denotes the average of the variable x, and m is the mean value of the variable x. The STD can be calculated to a parameter such as a patterned photoresist critical dimension (CD) using the above defined formula. In one example, the STD is calculated at every point in a field to a parameter over a period of time, such as all wafers measured at this point in the last week. Then among all the points in a field, the point with lest STD will be selected as the location for the measurement since this point is stable. Then next point with the lest STD excluding the first chosen point. Repeat the processing until the number of the sampling golden points are all determined.

Figure 6:
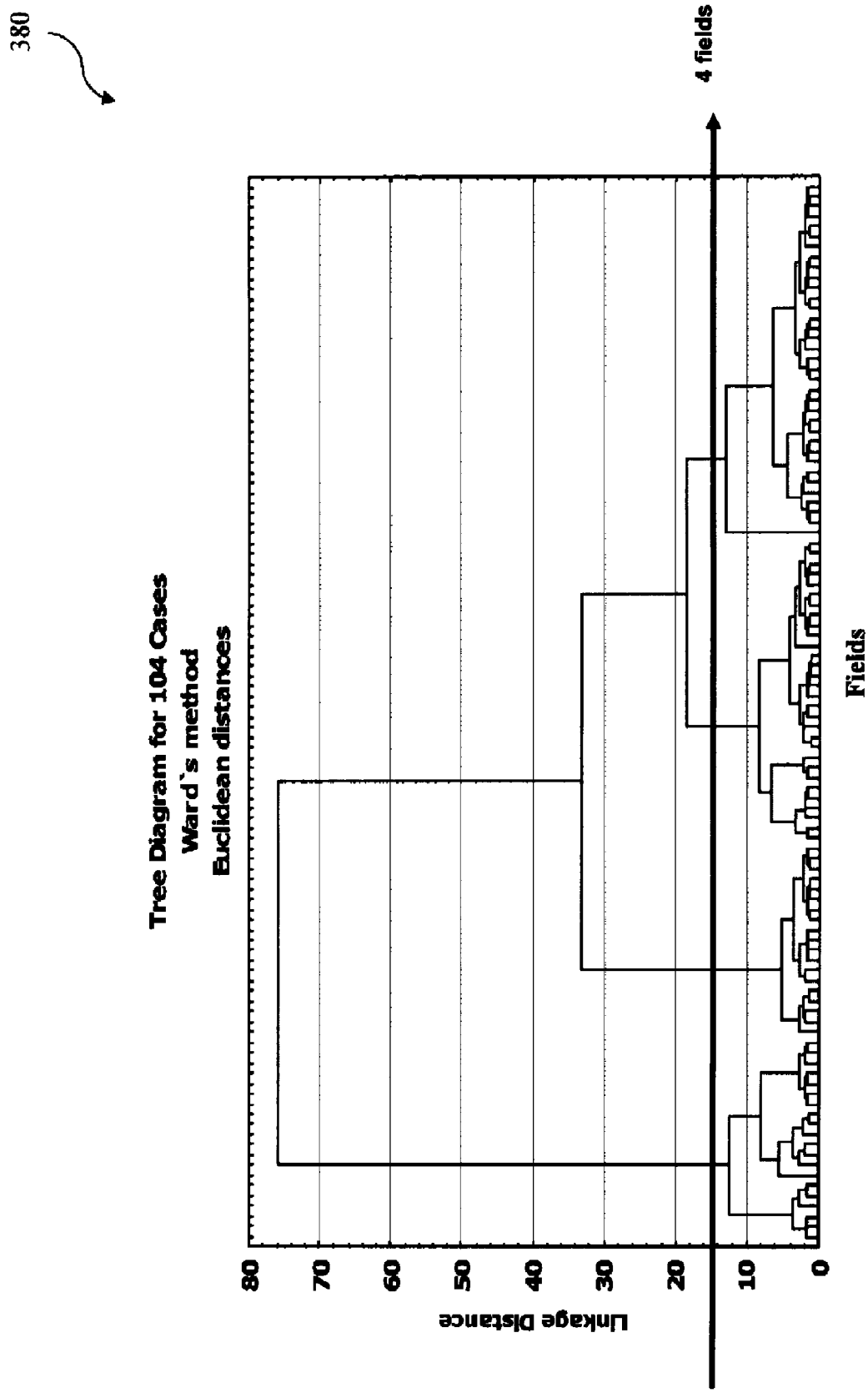
FIG. 6 is an exemplary diagram of field data vs. the linkage distance to be used in a clustering method to determine the number of sampling fields constructed according to various aspects of one embodiment of the present disclosure.

The process 350 proceeds to step 358 by determining the number of the full fields (sampling fields) to be measured using a cluster (or clustering) method. At this step, the all fields in a wafer are grouped in a number of groups according to a predefined or a given criteria. Then at least one full field in each group needs to be measured. Therefore, in one embodiment, the number of the sampling filed will be the number of the groups of the fields. The clustering methods can be used to determine the natural sub-groups in a data set. There are various techniques for clustering. In one embodiment, the clustering methods includes a classic hierarchical clustering (HC) method. The HC method can be used for analyzing various data for grouping with an agglomerative (bottom-up) approaches. The clustering process starts with each datum as an individual cluster. These clusters are then successively merged together to form new, larger clusters until all of the data are in one big cluster. The sequence of clusters is represented by a hierarchical binary tree, or the dendogram, which can be cut at a specific hierarchical level, referred as linkage distance or Euclidean distance to obtain a desired number of clusters. The topology of the clusters is a binary tree. During the clustering process, the number of clusters can only be reduced. The HC method is deterministic, as each datum will be assigned to one and only one cluster. A number of clusters is produced, which is a valuable feature for data structure discovery. One example is illustrated in a diagram 380 in FIG. 6, in which the x axis represents all data, such as average CD of the photoresist pattern in different fields, the y axis represents the linkage distance. When cutting the linkage distance at a level of about 15, then 4 clusters are obtained. In this particular case, 4 fields are chosen for sampling.

The process 350 may proceed to step 360 by determining the positions of the sampling fields according predefined rules. In one example, first select a center area, then calculate 0° and 45° fields to see which one is better based on some effective index, such as those used at step 356.

Figure 7:
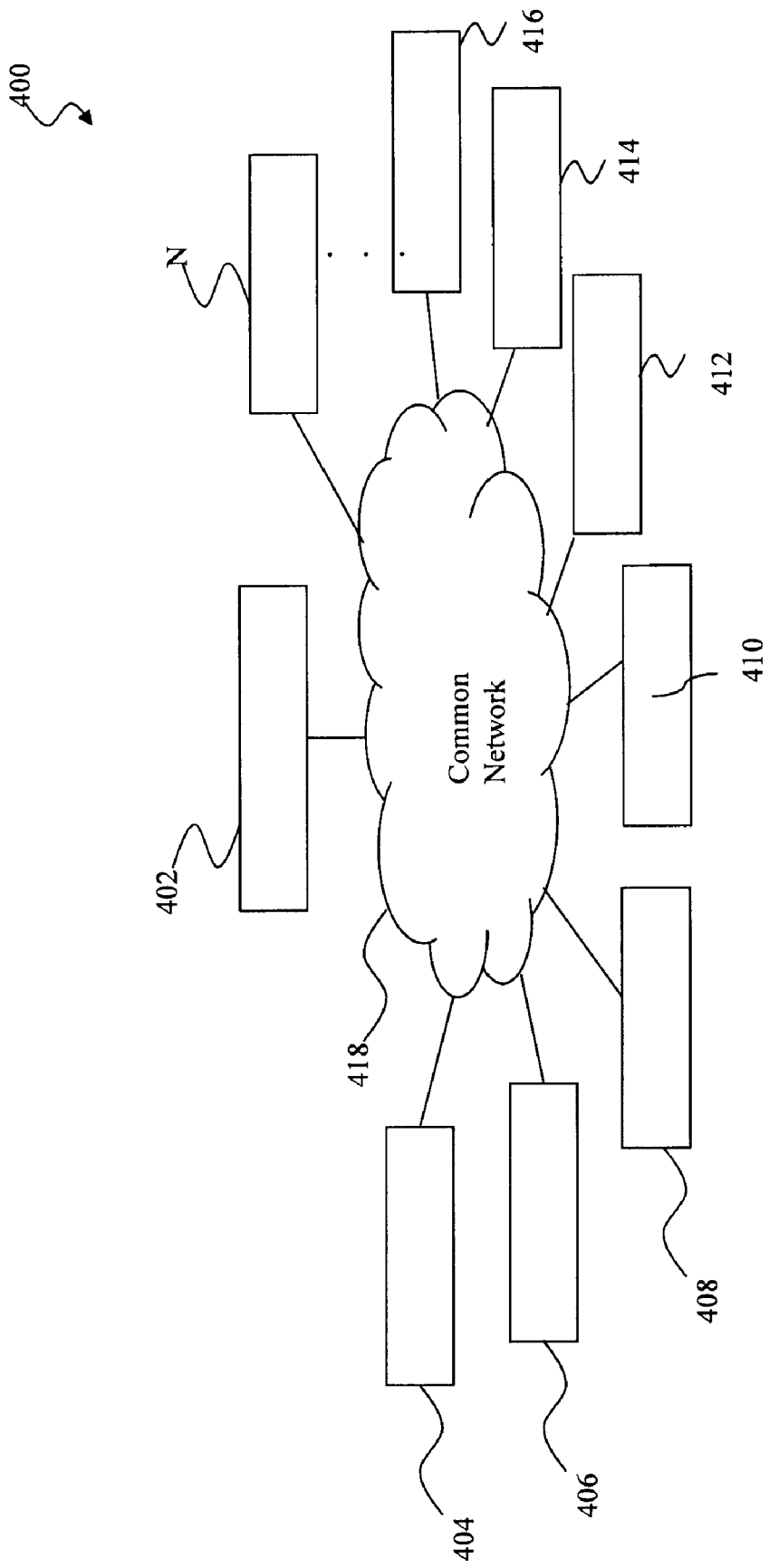
FIG. 7 is a block diagram of a semiconductor fabrication system, within which the semiconductor processing system of FIG. 1 is utilized.

FIG. 7 illustrates an integrated circuit fabrication system 400 within which the semiconductor processing system 100 of FIG. 1 may be utilized or distributed therein. The fabrication system 400 includes a plurality of entities 402, 404, 406, 408, 410, 412, 414, 416 . . . , N that are connected by a communications network 418. The network 418 may be a single network or may be a variety of different networks, such as an intranet and the Internet, and may include both wireline and wireless communication channels.

In the present example, the entity 402 represents a service system for manufacturing collaboration, the entity 404 represents an user, such as product engineer monitoring the interested products, the entity 406 represents an engineer, such as a processing engineer to control process and the relevant recipes, or an equipment engineer to monitor or tune the conditions and setting of the processing tools, the entity 408 represents a metrology tool for IC testing and measurement, the entity 410 represents a semiconductor processing tool, the entity 412 represents a virtual metrology module associated with the processing tool 410, the entity 414 represents an advanced processing control module associated with the processing tool 410 and additionally other processing tools, and the entity 416 represents a sampling module associated with the processing tool 410. Each entity may interact with other entities and may provide integrated circuit fabrication, processing control, and/or calculating capability to and/or receive such capabilities from the other entities.

The integrated circuit fabrication system 400 enables interaction among the entities for the purpose of integrated circuit (IC) manufacturing, as well as the advanced processing control of the IC manufacturing. In the present example, the advanced processing control includes adjusting the processing conditions, settings, and/or recipes of one processing tool applicable to the relevant wafers according to the metrology results. In another example, the metrology results are measured from a subset of processed wafers according to an optimal sampling rate determined based on the process quality and/or product quality. In another example, the metrology results are measured from chosen fields and points of the subset of processed wafers according to an optimal sampling field/point determined based on various characteristics of the process quality and/or product quality.

One of the capabilities provided by the IC fabrication system 400 may enable collaboration and information access in such areas as design, engineering, and processing, metrology, and advanced processing control. Another capability provided by the IC fabrication system 400 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

The present disclosure provides various embodiments of a semiconductor processing system and a method to utilize the processing system. Other variations may also be possible within the scope of the invention. In one embodiment, various steps of the method 200 may be implemented at least partially in parallel. In another embodiment, the sampling subset of wafers is chosen based on other combinations of the process quality, the virtual metrology index, metrology loading, tool health index and chamber coverage. The virtual metrology index is defined as the average parameter of the wafers predicted by the virtual metrology method. For example, the virtual metrology index may be defined as an average thickness of the deposited film predicted by the virtual metrology method. The tool health index is a parameter indicating the status of the processing tool. For example, the tool health index of a deposition tool may be defined as an average deposition rate of the processing tool under the given setting. If the average deposition rate is too higher or too lower, it may indicate the processing tool is experiencing a certain drifting or change. The setting of the processing tool may be tuned according to the metrology results.

Thus, the present disclosure provides a semiconductor manufacturing method. The method includes performing a first process to a first plurality of semiconductor wafers; determining a sampling rate (f) to the first plurality of semiconductor wafers based on process quality; determining sampling fields and sampling points to the first plurality of semiconductor wafers; measuring a subset of the first plurality of semiconductor wafers according to the sampling arte, the sampling fields and the sampling points; modifying a second process according to the measuring; and applying the second process to a second plurality of semiconductor waders.

In one embodiment, the performing of the first process further includes performing one process selected from the group consisting of etching, photolithography exposure, ion implantation, deposition, polishing, and thermal oxidation. The determining the sampling rate f may include determining the sampling rate according to a process capability Cpk. The determining the sampling rate may include relating the process capability Cpk and the sampling rate f using an average outgoing quality (AOQ) by a formula $AOQ_{ij}=(1-F_{ij})P_{ij}$, in which i denotes a product i, j denotes a processing tool j, $AOQ_{ij}$ denotes an average outgoing quality for the product i and the processing tool j, $F_{ij}$ denotes an average sampling rate for the product i and the processing tool j, and $P_{ij}$ denotes defective rate for the product i and the processing tool j. The Fij is defined in a formula as $F_{ij}=f_{ij}/[f_{ij}+(1-f_{ij})P_a^w]$, in which $f_{ij}$ is a sampling rate for the product i and the processing tool j, w is sampling wafer quantity in a lot, and $P_a$ is probability of acceptance of a given lot; $P_{ij}=2[1-\Phi(3Cpk(i,j))]$, in which $\Phi$ is normal distribution function and Cpk(i,j) is process capability parameter Cpk for the product i and the processing tool j; and the $AOQ_{ij}$ is equal or less than an average outgoing quality level (AOQL). The determining of the sampling fields and the sampling points may include determining a number of the sampling points according to a residual standard error (RSE). The determining of the sampling fields and the sampling points may include determining positions of the sampling points according to a standard deviation (STD). The determining of the sampling fields and the sampling points may include determining a number of the sampling fields using a clustering method. The determining the sampling rate may include determining the sampling rate using a lot sampling method for chamber coverage.

The present disclosure also provides another embodiment of a semiconductor manufacturing method. The method includes performing a process to a plurality of semiconductor wafers; determining an optimal sampling rate to the first plurality of semiconductor wafers based on process quality; measuring a portion of the first plurality of semiconductor wafers according to the optimal sampling rate; adjusting the process according to the measuring; and performing the adjusted process to a semiconductor wader. The method may further include determining sampling fields and sampling points to the plurality of semiconductor wafers, wherein the measuring includes measuring a portion of the first plurality of semiconductor wafers on the sampling fields and the sampling points. The determining of the sampling fields and the sampling points may include determining a number of the sampling points according to a residual standard error (RSE). The determining of the sampling fields and the sampling points may includes determining a number of the sampling fields using a clustering method. The determining of the optimal sampling rate may include determining the optimal sampling rate using a process capability parameter Cpk.

The present disclosure also provides an embodiment of a semiconductor manufacturing system. The system includes a processing tool designed to process semiconductor wafers; a sampling module designed for determining a sampling rate to the semiconductor wafers according to metrology loading and product quality; a metrology tool for measuring a subset of the semiconductor wafers according to the sampling rate; and a process control module for adjusting a process according to measured results from the metrology tool.

In one embodiment, the sampling module is designed to determine the sampling rate using process capability parameter Cpk. The sampling module may be designed to determine the sampling rate for optimized chamber coverage by specifying wafer identifications. The sampling module may be further designed to determine a number of sampling fields using a clustering method. The sampling module may be further designed to determine a number of sampling points using a residual standard error (RSE). The sampling module may be further designed to determine positions of the sampling points using a standard deviation (STD).

The present disclosure also provides another embodiment of a semiconductor manufacturing method. The method includes performing a first process to a first plurality of semiconductor wafers; determining an optimal sampling rate to the first plurality of semiconductor wafers based on process quality; measuring a subset of the first plurality of semiconductor wafers according to the optimal sampling rate; modifying a second process according to the measuring; and applying the second process to a second plurality of semiconductor waders.

In various embodiments, the performing of the first process may include performing one process selected from the group consisting of: etching, photolithography exposure, ion implantation, deposition, polishing, and thermal oxidation. The determining the optimal sampling rate may include determining the optimal sampling rate according to a process capability parameter Cpk. The determining the optimal sampling rate may include calculating an average outgoing quality (AOQ) according to the control parameter Cpk. The calculating the AOQ may include using a formula $AOQ_{ij}=(1-F_{ij})P_{ij}$, in which i denotes a product i, j denotes a processing tool j, $AOQ_{ij}$ denotes an average outgoing quality for the product i and the processing tool j, $F_{ij}$ denotes an average sampling rate for the product i and the processing tool j, and $P_{ij}$ denotes defective rate for the product i and the processing tool j. The Fij may be determined according to $F_{ij}=f_{ij}/[f_{ij}+(1-f_{ij})P_a^w]$, in which $f_{ij}$ is a sampling rate for the product i and the processing tool j, w is sampling wafer quantity in a lot, and Pa is probability of acceptance of a given lot. In one embodiment, $P_{ij}=2[1-\Phi(3Cpk(i,j))]$, in which $\Phi$ is normal distribution function and Cpk(i,j) is process capability parameter Cpk for the product i and the processing tool j. The determining the optimal sampling rate may include determining the optimal sampling rate using a virtual metrology method. The determining the optimal sampling rate may include determining the optimal sampling rate using a lot sampling method for chamber coverage. The determining the optimal sampling rate may include determining the optimal sampling rate using a dynamic wafer sampling technique.

The present disclosure also provides another embodiment of a semiconductor manufacturing method. The method includes performing a process to a plurality of semiconductor wafers; determining an optimal sampling rate to the first plurality of semiconductor wafers based on process quality; measuring a portion of the first plurality of semiconductor wafers according to the optimal sampling rate; adjusting the process according to the measuring; and performing the adjusted process to a semiconductor wader.

In various embodiments, the determining may include determining the optimal sampling rate using a process capability parameter Cpk. The determining may further include determining the optimal sampling rate greater than a predefined minimum sampling rate. The determining further may include determining the optimal sampling rate according to metrology loading. The determining may further include determining the optimal sampling rate using a virtual metrology technique.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A semiconductor manufacturing method, comprising:
   performing a first process to a first plurality of semiconductor wafers each having a plurality of fields;
   determining a sampling rate to the first plurality of semiconductor wafers based on process quality, wherein the determining the sampling rate includes determining the sampling rate according to a process capability Cpk, wherein the determining the sampling rate includes relating the process capability Cpk and the sampling rate using an average outgoing quality (AOQ) by a formula AOQij=(1−Fij)Pij, in which i denotes a product i, j denotes a processing tool j, AOQij denotes an average outgoing quality for the product i and the processing tool j, Fij denotes an average sampling rate for the product i and the processing tool j, and Pij denotes defective rate for the product i and the processing tool j;

determining sampling fields and sampling points to the first plurality of semiconductor wafers;

measuring a subset of the first plurality of semiconductor wafers according to the sampling rate, the sampling fields, and the sampling points;

modifying a second process according to the measuring; and applying the second process to a second plurality of semiconductor wafers.

2. The method of claim 1, wherein the performing of the first process includes performing one process selected from the group consisting of etching, photolithography exposure, ion implantation, deposition, polishing, and thermal oxidation.

3. The method of claim 1, wherein:

the Fij is defined in a formula as Fij=fij/[fij+(1−fij)Paw, in which fij is a sampling rate for the product i and the processing tool j, w is sampling wafer quantity in a lot, and Pa is probability of acceptance of a given lot;

Pij=2[1−(3 Cpk(i,j))], in which is normal distribution function and Cpk(i,j) is process capability parameter Cpk for the product i and the processing tool j; and the AOQij is equal or less than an average outgoing quality level (AOQL).

4. The method of claim 1, wherein the determining of the sampling fields and the sampling points includes determining a number of the sampling points according to a residual standard error (RSE).

5. The method of claim 1, wherein the determining of the sampling fields and the sampling points includes determining positions of the sampling points according to a standard deviation (STD).

6. The method of claim 1, wherein the determining of the sampling fields and the sampling points includes determining a number of the sampling fields using a clustering method.

7. The method of claim 1, wherein the determining the sampling rate includes determining the sampling rate using a lot sampling method for chamber coverage.

8. A semiconductor manufacturing method, comprising:

performing a process to a plurality of semiconductor wafers;

determining an optimal sampling rate to the plurality of semiconductor wafers based on process quality, wherein the determining of the optimal sampling rate includes determining the optimal sampling rate using a process capability parameter Cpk, wherein the process capability parameter Cpk is represented by a formula Cpk=min [(USL−μ)/3σ, (μ−LSL)/3σ], in which μ is a mean, σ is a standard deviation, USL is an upper specification limit and LSL is a lower specification limit;

measuring a portion of a first plurality of semiconductor wafers according to the optimal sampling rate;

adjusting the process according to the measuring; and performing the adjusted process to another semiconductor wafer.

9. The method of claim 8, further comprising determining sampling fields and sampling points to the plurality of semiconductor wafers, wherein the measuring includes measuring a portion of the plurality of semiconductor wafers in accordance with the sampling fields and the sampling points.

10. The method of claim 9, wherein the determining of the sampling fields and the sampling points includes determining a number of the sampling points according to a residual standard error (RSE).

11. The method of claim 9, wherein the determining of the sampling fields and the sampling points includes determining a number of the sampling fields using a clustering method.

12. The method of claim 8, wherein the determining the optimal sampling rate includes determining the sampling rate using a lot sampling method for chamber coverage.

13. A semiconductor manufacturing system, comprising:

a processing tool designed to process semiconductor wafers;

a sampling module designed for determining a sampling rate to the semiconductor wafers according to metrology loading and product quality, wherein the sampling module is designed to determine the sampling rate using a process capability parameter Cpk, wherein the sampling module in determining the sampling rate relates the process capability parameter Cpk and the sampling rate using an average outgoing quality (AOQ);

a metrology tool for measuring a subset of the semiconductor wafers according to the sampling rate; and a process control module for adjusting a process according to measured results from the metrology tool wherein the process capability parameter Cpk is represented by a formula Cpk=min [[(USL−μ)/3σ, (μ−LSL)/3 σ], in which μ is a mean, σ is a standard deviation, USL is an upper specification limit and LSL is a lower specification limit.

14. The system of claim 13, wherein the sampling module is designed to determine the sampling rate for optimized chamber coverage by specifying wafer identifications.

15. The system of claim 13, wherein the sampling module is further designed to determine a number of sampling fields using a clustering method.

16. The system of claim 13, wherein the sampling module is further designed to determine a number of sampling points using a residual standard error (RSE).

17. The system of claim 16, wherein the sampling module is further designed to determine positions of the sampling points using a standard deviation (STD).

18. The system of claim 13, wherein the process includes is selected from the group consisting of etching, photolithography exposure, ion implantation, deposition, polishing, and thermal oxidation.

19. The method of claim 13, wherein the AOQ is represented by a formula AOQij=(1−Fij)Pij, in which i denotes a product i, j denotes a processing tool j, AOQij denotes an average outgoing quality for the product i and the processing tool j, Fij denotes an average sampling rate for the product i and the processing tool j, and Pij denotes defective rate for the product i and the processing tool j.

* * * * *